United States Patent
Aoki et al.

(10) Patent No.: US 8,322,024 B2
(45) Date of Patent: Dec. 4, 2012

(54) MAGNETIC FIELD GENERATOR MANUFACTURING METHOD

(75) Inventors: Masaaki Aoki, Takatsuki (JP); Tsuyoshi Tsuzaki, Osaka-fu (JP)

(73) Assignee: Hitachi Metals, Ltd., Tokyo (JP)

( * ) Notice: Subject to any disclaimer, the term of this patent is extended or adjusted under 35 U.S.C. 154(b) by 225 days.

(21) Appl. No.: 12/382,097

(22) Filed: Mar. 9, 2009

(65) Prior Publication Data

US 2009/0243774 A1     Oct. 1, 2009

Related U.S. Application Data

(62) Division of application No. 10/503,932, filed on Aug. 13, 2004, now abandoned.

(30) Foreign Application Priority Data

Feb. 15, 2002 (JP) ................................. 2002-37746

(51) Int. Cl.
*H05F 7/06* (2006.01)
(52) U.S. Cl. .......................................... 29/607; 29/606
(58) Field of Classification Search .................. 29/607, 29/592.1, 596, 602.1, 606; 324/318; 335/296, 335/301

See application file for complete search history.

(56) References Cited

U.S. PATENT DOCUMENTS

| | | | | |
|---|---|---|---|---|
| 4,672,346 A * | 6/1987 | Miyamoto et al. | ............ | 335/296 |
| 4,827,235 A * | 5/1989 | Inomata et al. | ............... | 335/297 |
| 6,166,617 A * | 12/2000 | Laskaris et al. | ............... | 335/299 |
| 6,336,989 B1 * | 1/2002 | Aoki et al. | ................. | 156/275.7 |
| 6,452,472 B1 * | 9/2002 | Aoki et al. | ..................... | 335/296 |
| 6,634,089 B1 * | 10/2003 | Aoki et al. | ...................... | 29/607 |
| 6,650,214 B2 * | 11/2003 | Aoki et al. | ..................... | 335/299 |
| 6,662,434 B2 * | 12/2003 | Laskaris et al. | ................. | 29/607 |
| 6,784,776 B2 * | 8/2004 | Aoki et al. | ..................... | 335/299 |
| 6,897,751 B2 * | 5/2005 | Aoki et al. | ..................... | 335/296 |
| 6,967,481 B2 * | 11/2005 | Chonan et al. | ................. | 324/319 |
| 7,051,425 B2 * | 5/2006 | Aoki et al. | ...................... | 29/607 |
| 7,065,860 B2 * | 6/2006 | Aoki et al. | ...................... | 29/607 |
| 7,143,507 B2 * | 12/2006 | Aoki et al. | ...................... | 29/607 |
| 7,631,411 B2 * | 12/2009 | Mao et al. | ....................... | 29/458 |

(Continued)

FOREIGN PATENT DOCUMENTS

JP     55-055504     4/1980

(Continued)

OTHER PUBLICATIONS

International Search Report (and Partial translation thereof (4 pages).

(Continued)

*Primary Examiner* — David Angwin
(74) *Attorney, Agent, or Firm* — Kratz, Quintos & Hanson, LLP

(57) ABSTRACT

There is provided a method of manufacturing a magnetic field generator (10) that includes a pair of plate yokes (12a), (12b) which are opposed to each other, with their opposing faces provided with respective permanent magnet assemblies (14a), (14b) which have faces opposing to each other, to which pole pieces (16a), (16b) are fixed respectively, and include permanent magnets (18). The permanent magnets (18), (28) include R—Fe—B magnets. During manufacturing, the assembled magnetic field generator (10) is heated in its entirety at a temperature not lower than 40° C. and not higher than 70° C., whereby the R—Fe—B magnets are magnetized to a magnetization rate not smaller than 80% and not greater than 99.9%.

7 Claims, 9 Drawing Sheets

U.S. PATENT DOCUMENTS

| | | | |
|---|---|---|---|
| 7,710,081 B2 * | 5/2010 | Saban et al. | 322/89 |
| 7,802,354 B2 * | 9/2010 | Mao et al. | 29/525.01 |
| 7,960,948 B2 * | 6/2011 | Saban et al. | 322/89 |
| 8,040,007 B2 * | 10/2011 | Petrov et al. | 310/156.27 |
| 2002/0171526 A1 * | 11/2002 | Laskaris et al. | 336/110 |

FOREIGN PATENT DOCUMENTS

| | | |
|---|---|---|
| JP | 58-130510 | 8/1983 |
| JP | 60-076110 | 4/1985 |
| JP | 61-140106 | 6/1986 |
| JP | 61-281505 | 12/1986 |
| JP | 63-169710 | 7/1988 |
| JP | 02-148704 | 7/1990 |
| JP | 4-313204 | 11/1992 |
| JP | 06-163239 | 6/1994 |
| JP | 7-7110 | 1/1995 |
| JP | 07-029716 | 1/1995 |
| JP | 08-339916 | 12/1996 |
| JP | 09-056691 | 3/1997 |
| JP | 09-131025 | 5/1997 |
| JP | 10-275720 | 10/1998 |
| JP | 10-326710 | 12/1998 |
| JP | 2000-51175 | 2/2000 |
| JP | 2001-044031 | 2/2001 |
| JP | 2001-85223 | 3/2001 |
| JP | 2001-326118 | 11/2001 |

OTHER PUBLICATIONS

Office Action to the corresponding Chinese Application No. 03803891.9 along with English translation.

Notification of Reason(s) for Refusal to the corresponding Japanese Patent Appln. No. 2003-35128.

Notification of Reasons for Refusal dated May 18, 2010 to the corresponding Japanese Patent Application No. 2007-330824 with English translation.

* cited by examiner

F I G. 5
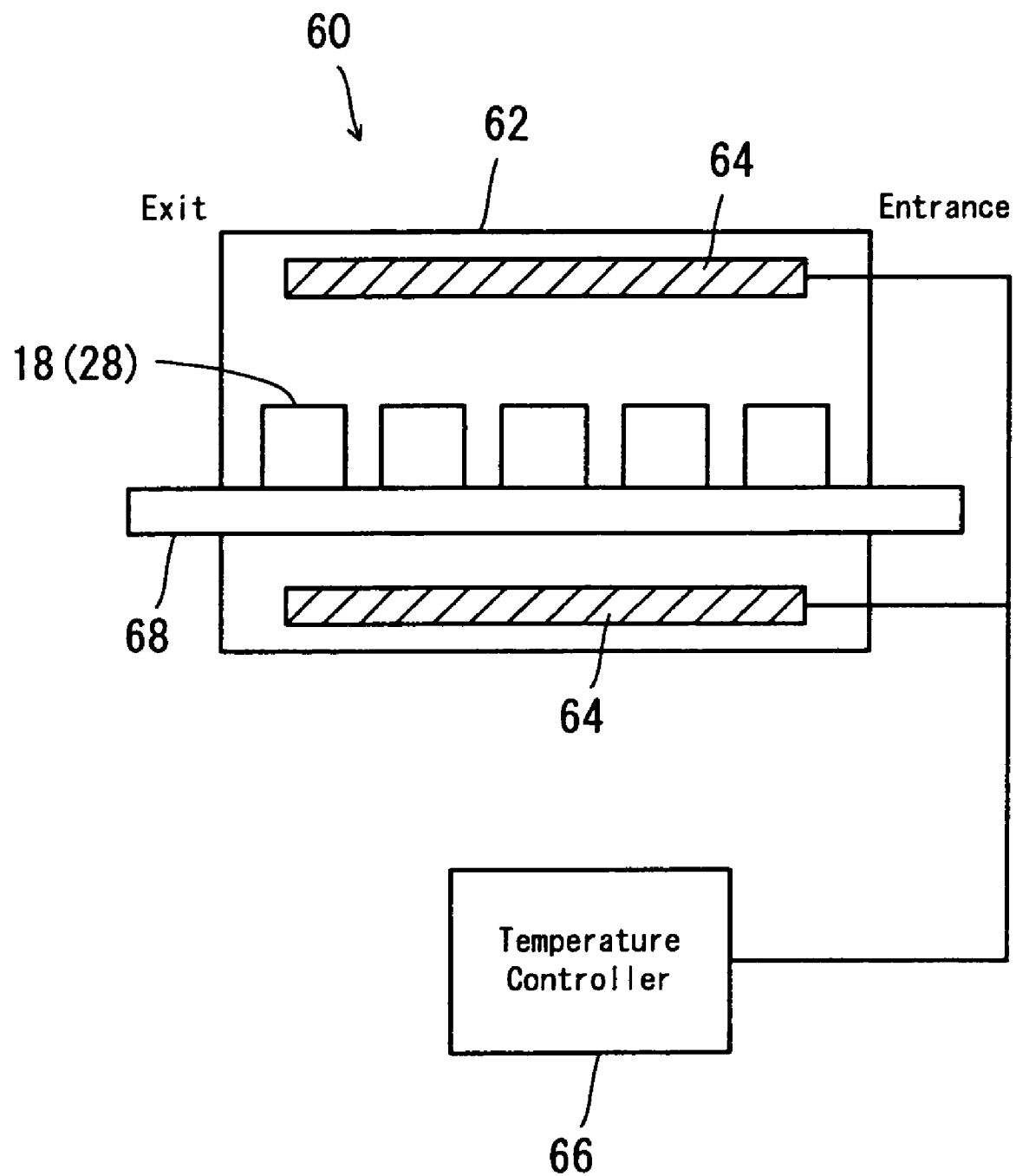

Measurements on High Temperature Demagnetization

MAGNETIC FIELD GENERATOR MANUFACTURING METHOD

This application is a division of U.S. Utility Patent Application 10/503,932, the entire contents of which are entirely incorporated herein by reference, that was filed on Aug. 13, 2004 now abandoned and which claimed priority from Feb. 15, 2002, of JP 2002-37746.

TECHNICAL FIELD

The present invention relates to a magnetic field generator and a manufacturing method thereof. More specifically, the present invention relates to a magnetic field generator for MRI and a manufacturing method thereof.

BACKGROUND ART

Conventionally, a magnetic field generator for MRI receives complete adjustment of magnetic field intensity and magnetic field uniformity before shipment, and then transported to destination in a container for example.

However, despite such deliberate procedures, it sometimes happens that upon arrival, the magnetic field intensity has decreased, or the magnetic field uniformity has deteriorated down below an acceptable limit, and therefore readjustment must be made to the magnetic field generator.

This problem is particularly conspicuous in a magnetic field generator which makes use of magnetic flux leakage prevention magnets in order to reduce magnetic flux leakage and to concentrate magnetic flux from the main magnets to a center region. The problem is also conspicuous in exporting a magnetic field generator using a container, as well as in a magnetic field generator which has become popular recently in which a strong magnetic field (with a center magnetic field intensity being 0.25 T or greater) is generated for increased imaging speed.

It is therefore a primary object of the present invention to provide a magnetic field generator and a method of manufacturing it, capable of reducing the decline in the magnetic field intensity and the deterioration of magnetic field uniformity during transportation.

DISCLOSURE OF THE INVENTION

According to an aspect of the present invention, there is provided a magnetic field generator comprising: a pair of first magnets including a R—Fe—B magnet which are faced to each other with a space in between; and a yoke supporting the first magnets. The R—Fe—B magnet is magnetized to a magnetization rate not smaller than 80% and not greater than 99.9%.

In the present application, the term "magnetization rate" means a rate of magnetization at a normal temperature (25° C.).

According to the present invention, the R—Fe—B magnet (R represents a rare-earth element including Yttrium (Y), Fe represents iron and B represents boron) is controlled to have a final magnetization rate of not smaller than 80% and not greater than 99.9%, whereby it becomes possible to reduce demagnetization caused by time or environmental factors such as temperature increase, of a magnetic field generator which has been assembled without altering its intrinsic coercive force. Therefore, it becomes possible to reduce decline in the magnetic field intensity and deterioration of magnetic field uniformity during transportation of the magnetic field generator, making sure that the magnetic field generator has a high magnetic field uniformity upon arrival at a place of installation.

It should be noted here that if the final magnetization rate of the R—Fe—B magnet is less than 80%, it becomes impossible to take full advantage of magnetic characteristics of the magnet, which leads to use of an increased amount of magnet and decreased efficiency. On the other hand, if the magnet is used at a final magnetization rate exceeding 99.9%, temperature changes and so on during transportation cause a large demagnetization.

The present invention is suitable to a case where the magnetic field generator further comprises pole pieces provided on the opposed faces of the pair of the first magnets respectively, and the pole piece includes an annular projection and a second magnet for prevention of magnetic flux leakage provided on an outer side surface of the annular projection. Generally, the second magnet provided for prevention of magnetic flux leakage enables to reduce magnetic flux leakage, but on the other hand the second magnet tends to demagnetize the first magnet which is the main magnet. However, according to the present invention, the magnetization rate of the R—Fe—B magnet included in the first magnet is lowered in advance, whereby the addition of the second magnet does not adversely influence the first magnet as much, and it becomes possible to reduce change in magnetic field intensity and deterioration of magnetic field uniformity in the magnetic field generator. Further, if a heating process is performed to the magnetic field generator after the second magnet for prevention of magnetic flux leakage is assembled, it becomes possible to reduce change in magnetic field intensity and deterioration of magnetic field uniformity thereafter, to a greater extent.

The present invention is suitable to a case where the R—Fe—B magnet does not essentially contain Co and/or Dy. R—Fe—B magnets which do not contain cobalt (Co) or dysprosium (Dy) have a small intrinsic coercive force, are prone to thermal demagnetization, weak to reverse magnetic fields, and therefore more susceptible to changes in the magnetic field intensity and magnetic field uniformity in each case. However, according to the present invention, by lowering the final magnetization rate of the R—Fe—B magnet in advance, it is possible to reduce change in magnetic field intensity and deterioration of magnetic field uniformity even if the magnet used does not contain Co or Dy which are expensive elements.

It should be noted that in this invention, the term "not essentially contain" means that a rate of inclusion is not greater than 0.1 weight percent.

Further, the present invention is suitable to a case where required uniformity of magnetic field intensity is within 100 ppm (i.e. at each point in a uniform magnetic field space, magnetic field intensity is within ±50 ppm of a magnetic field intensity at the center (reference magnetic field intensity)). Since the present invention is able to reduce change in magnetic field intensity and deterioration of magnetic field uniformity, it is easy to control magnetic field intensity errors within the given range even in a case where a highly precise magnetic field intensity is required with an error range of 100 ppm.

The present invention is suitable to a case where the magnetic field generator is to be transported in a container. For instance, when the magnetic field generator is transported in a container which is not provided with air conditioning, temperature inside the container can rise as high as 70° C., which can easily cause change in the magnetic field intensity and deterioration of magnetic field uniformity. However, according to the present invention, it is possible to reduce the change in magnetic field intensity and the deterioration of magnetic field uniformity even when transportation is made in such a container.

Further, the present invention is suitable to a case where a uniform magnetic field space has a magnetic field intensity not smaller than 0.25 T. Demagnetization occurs at a percentage, and therefore amount of change in magnetic field intensity becomes larger as a magnetic field intensity is larger. Therefore, when a uniform magnetic field space has a large magnetic field intensity such as not smaller than 0.25 T, the amount of change in the magnetic field intensity will also be large. However, according to the present invention, it is possible to reduce changes in the magnetic field intensity even when the magnetic field intensity is as large as the above.

It should be noted that the term "uniform magnetic field space" is a magnetic field space in which differences in the magnetic field intensity is within 100 ppm.

According to another aspect of the present invention, there is provided a method of manufacturing a magnetic field generator, comprising: a first step of assembling a magnetic field generator including a R—Fe—B magnet, and a second step of heating the entire magnetic field generator which has been assembled, at a temperature not lower than 40° C. and not higher than 70° C.

In this invention, a magnetic field generator is assembled using a magnet which has a magnetization rate exceeding 99.9%, and then the entire magnetic field generator is heated, whereby the magnet included in the magnetic field generator is demagnetized to a lower magnetization rate. This assures that a magnetic field generated by the magnetic field generator is stable over a long time despite environmental changes such as temperature increase, making possible to reduce decline in the magnetic field intensity and deterioration of magnetic field uniformity during transportation of the magnetic field generator, allowing the magnetic field generator to maintain a highly accurate magnetic field upon arrival at a place of installation.

According to still another aspect of the present invention, there is provided a method of manufacturing a magnetic field generator, comprising: a first step of assembling a pole-piece unit by fixing a magnet including a R—Fe—B magnet to a plate yoke; a second step of heating the pole-piece unit which has been assembled, at a temperature not lower than 40° C. and not higher than 70° C.; and a third step of fixing the heated pole-piece unit to a supporting yoke.

In this invention, a pole-piece unit is assembled and then the entire pole-piece unit is heated, whereby the magnet included in the pole-piece unit is demagnetized to a lower magnetization rate. This assures that a magnetic field generated by a magnetic field generator using this pole-piece unit is stable over a long time, making possible to reduce decline in the magnetic field intensity and deterioration of magnetic field uniformity during transportation of the magnetic field generator. Further, the method requires a smaller heating space than the case where the entire magnetic field generator is heated.

According to still another aspect of the present invention, there is provided a method of manufacturing a magnetic field generator, comprising: a first step of forming a magnet including a R—Fe—B magnet; a second step of heating the magnet at a temperature not lower than 40° C. and not higher than 70° C.; a third step of magnetizing the heated magnet; and a fourth step of fixing the magnetized magnet to a plate yoke.

In this invention, a magnet is heated and then magnetized, individually, whereby the magnet is magnetized to a low magnetization rate. This assures that a magnetic field generated by a magnetic field generator using this magnet is stable over a long time, making possible to reduce decline in the magnetic field intensity and deterioration of magnetic field uniformity during transportation of the magnetic field generator. Further, the method requires a smaller heating space than the case where the entire magnetic field generator is heated or the case where the pole-piece unit is heated, making possible to make use of a small heater.

According to another aspect of the present invention, there is provided a method of manufacturing a magnetic field generator, comprising: a first step of forming a magnet including a R—Fe—B magnet; a second step of magnetizing the magnet to a magnetization rate exceeding 99.9%; a third step of demagnetizing the magnetized magnet to a magnetization rate not smaller than 80% and not greater than 99.9%; and a fourth step of fixing the demagnetized magnet to a plate yoke.

In this invention, a magnet is magnetized to a magnetization rate exceeding 99.9% and then demagnetized to a lower magnetization rate. This assures that a magnetic field generated by a magnetic field generator using this magnet is stable over a long time, making possible to reduce decline in the magnetic field intensity and deterioration of magnetic field uniformity during transportation of the magnetic field generator. Further, operating efficiency is high because demagnetizing process is made when the magnet is still in individual state of magnet.

BRIEF DESCRIPTION OF THE DRAWINGS

FIG. 5 is a schematic diagram showing an example of a heater used in the present invention;

FIG. 8(a) shows a magnetic flux distribution in a magnetic field generator which has magnetic flux leakage prevention magnets, whereas

BEST MODE FOR CARRYING OUT THE INVENTION

Hereinafter, an embodiment of the present invention will be described with reference to the drawings.

Figure 1:
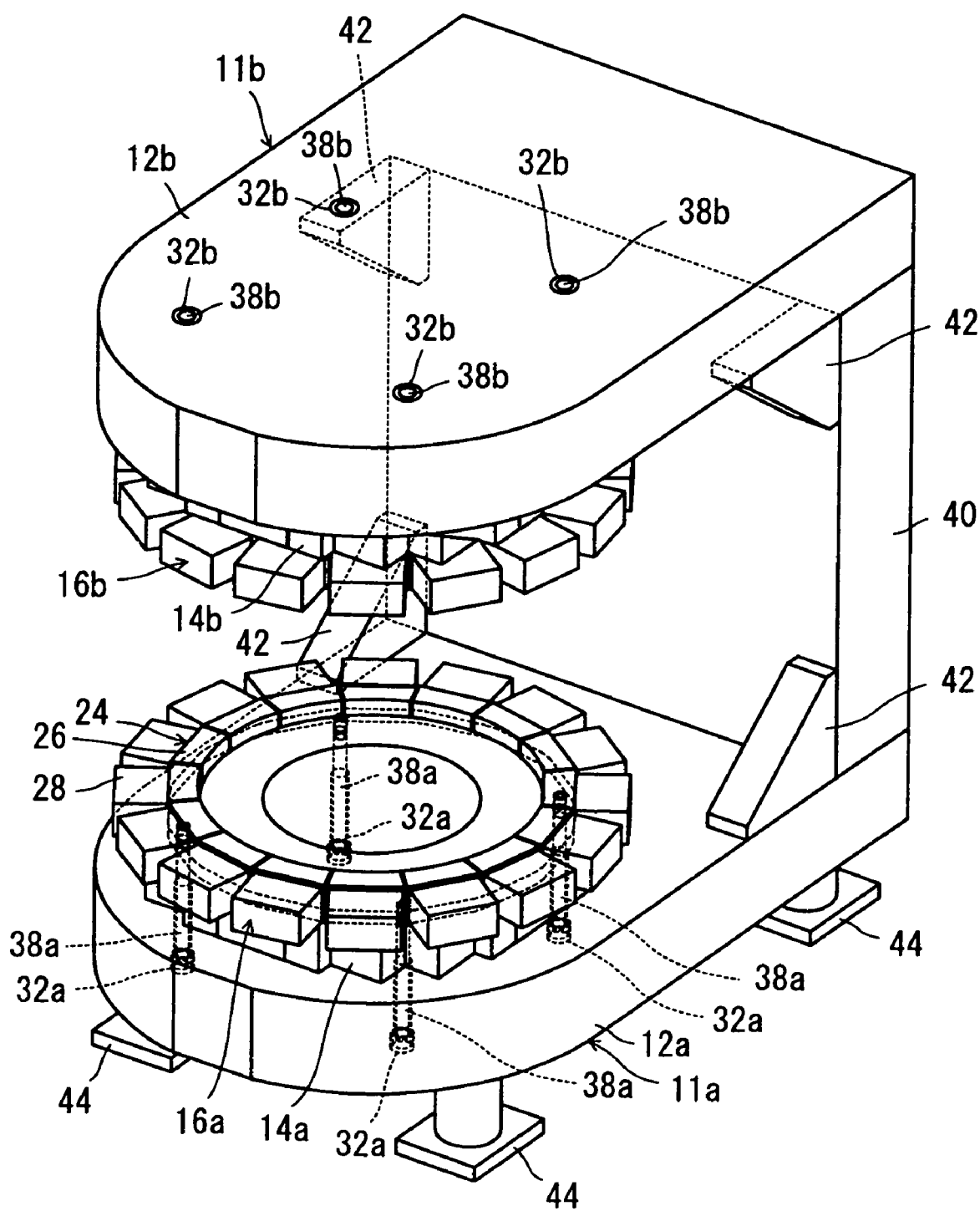
FIG. 1 is a perspective view of an embodiment of the present invention.
Figure 2:
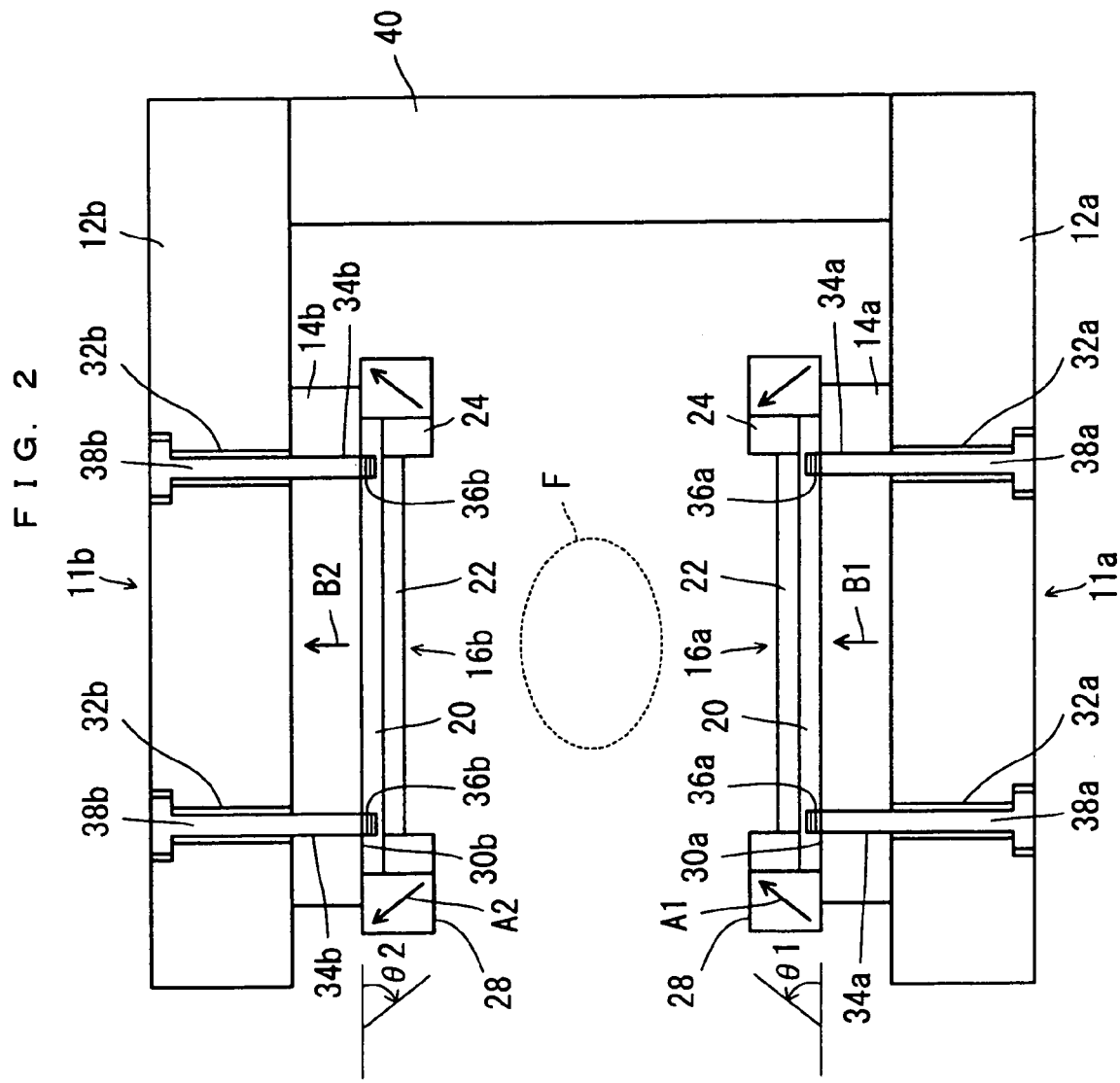
FIG. 2 is a schematic diagram showing a primary portion of the embodiment in FIG. 1.

Referring to FIG. 1 and FIG. 2, a magnetic field generator 10 for MRI as an embodiment of the present invention is an open type magnetic field generator for MRI, and includes a pair of pole-piece units 11a, 11b which are faced to each other forming a space in between.

The pole-piece units 11a, 11b include plate yokes 12a, 12b respectively. This pair of plate yokes 12a, 12b are opposed to each other, with their opposing faces provided with permanent magnet assemblies 14a, 14b respectively. The permanent magnet assemblies 14a, 14b have faces opposing to each other, to which pole pieces 16a, 16b are fixed respectively.

Figure 3:
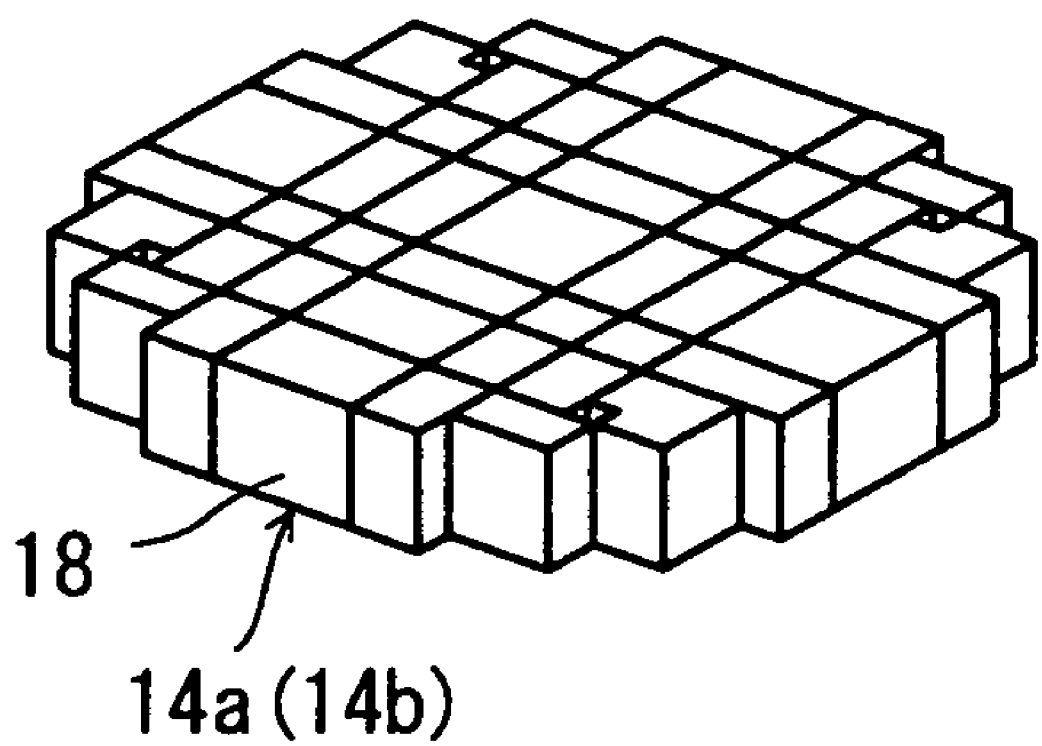
FIG. 3 is a perspective view of an example of a permanent magnet assembly used in the present invention.

As is clear from FIG. 3, the permanent magnet assemblies 14a, 14b each include a plurality of parallelepiped permanent magnets 18. The permanent magnets 18 are provided by e.g. NEOMAX-47 (manufactured by Sumitomo Special Metals Co., Ltd), or a high magnetic flux density type R—Fe—B magnet which includes essentially no Co and/or Dy, and is magnetized to e.g. a magnetization rate not smaller than 80% and not greater than 99.9% at the normal temperature. For instance, the permanent magnet 18 which will have a magnetic flux density of 0.3824 T at a magnetization rate of 100% is magnetized to have a magnetic flux density of 0.3820 T. The permanent magnet 18 is obtained by assembling a plurality of unillustrated unit magnets.

The pole piece 16a includes a disc-shaped base plate 20 made of e.g. iron disposed on the permanent magnet assembly 14a. The base plate 20 has a surface provided with a silicon steel plate 22 in order to prevent generation of eddy current. The silicon steel plate 22 is fixed onto the base plate 20 with an adhesive. The base plate 20 has a circumferential edge surrounded by an annular projection 24 made of iron for example, for increased and uniform magnetic field intensity in the circumferential edge area. The annular projection 24 includes a plurality of annular projection pieces 26. The annular projection 24 is formed by fixing each of the annular projection pieces 26 on a circumferential edge of the silicon steel plate 22.

Each annular projection 24 has an outer side surface provided with a permanent magnet 28 for prevention of magnetic flux leakage. The permanent magnet 28 is provided by NEOMAX-39SH (manufactured by Sumitomo Special Metals Co., Ltd), or a high coercive force type R—Fe—B magnet, and is magnetized to e.g. a magnetization rate not smaller than 80% and not greater than 99.9% at the normal temperature. For instance, the permanent magnet 28 which will have a magnetic flux density of 0.3824 T at a magnetization rate of 100% is magnetized to have a magnetic flux density of 0.3820 T. The permanent magnet 28 is obtained by assembling a plurality of unillustrated unit magnets.

The permanent magnet 28 enables to induce magnetic flux between the pole pieces 16a, 16b, and to reduce magnetic flux leakage. In order to prevent magnetic flux leakage from the bottom of the permanent magnet 28, the permanent magnet 28 preferably has its bottom essentially contacted (placed within 5 mm) to the permanent magnet assembly 14a. When the permanent magnet 28 and the permanent magnet assembly 14a are placed within such a close distance, the magnets are prone to demagnetization, and this is also true for the pole piece 16b.

As shown in FIG. 2, the permanent magnets 28 on the lower pole piece 16a are magnetized in a magnetization direction A1 or in an inward direction, which is different from a magnetization direction B1 for each permanent magnet 18 of the permanent magnet assembly 14a. These permanent magnets 28 are magnetized at a magnetization angle of θ1, which is an angle made by the magnetization direction A1 of the permanent magnet 28 with respect to a main surface 30a (horizontal) of the permanent magnet assembly 14a. On the other hand, the permanent magnets 28 on the upper pole piece 16b are magnetized in a magnetization direction A2 or in an outward direction, which is different from a magnetization direction B2 for each permanent magnet 18 of the permanent magnet assembly 14b. These permanent magnets 28 are magnetized at a magnetization angle of θ2, which is an angle made by the magnetization direction A2 of the permanent magnet 28 with respect to a main surface 30b (horizontal) of the permanent magnet assembly 14b.

The plate yokes 12a, 12b are respectively formed with a plurality of through holes 32a, 32b. The permanent magnet assemblies 14a, 14b are respectively formed with through holes 34a, 34b at locations corresponding to the through holes 32a, 32b. Further, the pole pieces 16a, 16b have their respective base plates 20 formed with threaded holes 36a, 36b, at locations corresponding to the through holes 34a, 34b respectively.

With the above construction, a fixing bolt 38a for fixing the pole piece is inserted into each of the through holes 32a and 34a, i.e. through the plate yoke 12a and the permanent magnet assembly 14a, and threaded into the threaded hole 36a, fixing the pole piece 16a to the main surface of the permanent magnet assembly 14a. Likewise, a fixing bolt 38b for fixing the pole piece is inserted into each of the through holes 32b and 34b, i.e. through the plate yoke 12b and the permanent magnet assembly 14b, and threaded into the threaded hole 36b, fixing the pole piece 16b to the main surface of the permanent magnet assembly 14b.

The plate yokes 12a, 12b are magnetically connected by a platy supporting yoke 40. Specifically, the supporting yoke 40 has its lower end surface faced by an upper end surface of the plate yoke 12a whereas the supporting yoke 40 has its upper end surface faced by a lower end surface of the plate yoke 12b when the supporting yoke 40 is connected to the plate yokes 12a, 12b. Therefore, the supporting yoke 40 is connected to each of the plate yokes 12a, 12b generally at a 90-degree angle, making up a shape of tipped U as in a side view.

Referring to FIG. 1, reinforcing members 42 are formed on an inner surface made by the plate yoke 12a and the supporting yoke 40, at locations farthest from the permanent magnet assembly 14a (According to the present embodiment, the locations represent two ends of an inner surface made by the plate yoke 12a and the supporting yoke 40). Likewise, reinforcing members 42 are formed on an inner surface made by the plate yoke 12b and the supporting yoke 40, at locations farthest from the permanent magnet assembly 14b (According to the present embodiment, the locations represent two ends of an inner surface made by the plate yoke 12b and the supporting yoke 40). Therefore, the plate yoke 12a and the supporting yoke 40 as well as the plate yoke 12b and the supporting yoke 40 are connected more strongly by the reinforcing members 42.

The plate yoke 12a has a lower surface provided with four legs 44.

In the magnetic field generator 10 as described above, a magnetic field intensity required in a uniform magnetic field space F (See FIG. 2) is not smaller than 0.25 T for example.

Next, description will cover manufacturing methods of the magnetic field generator 10.

Figure 4:
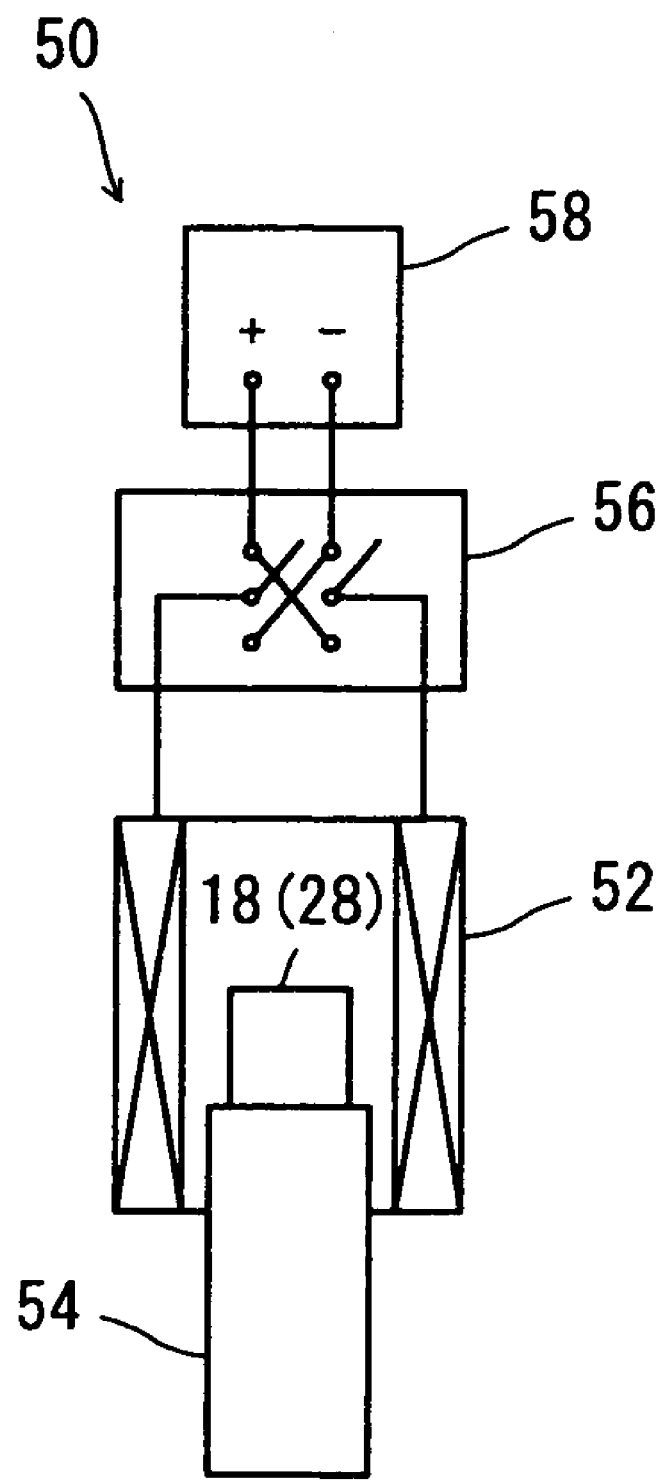
FIG. 4 is a schematic diagram showing an example of a magnetizer used in the present invention.

It should be noted here that the permanent magnet 18 which is used as a main magnet and the permanent magnet 28 which is used as a magnetic flux leakage prevention magnet are magnetized and demagnetized using a magnetizer 50 such as shown FIG. 4. The magnetizer 50 includes a magnetizing coil 52. The permanent magnet 18 or the permanent magnet 28 is placed on a table 54, and then inserted into the magnetizing coil 52. The magnetizing coil 52 is connected to a magnetizing power source 58 via a selector switch 56. Therefore, the magnetizer 50 can work as a magnetizer or a demagnetizer depending on an operation of the selector switch 56.

Further, the permanent magnets 18 and 28 are heated in a heating unit 60 such as shown in FIG. 5. The heating unit 60 includes a heating bath 62 having an upper portion and a lower portion each provided with a heater 64. The heaters 64 are controlled by a temperature controller 66. The permanent magnets 18 and 28 are transported from an entrance to an exit of the heating bath 62 by a conveyer 68. The permanent magnet 18 (28) is heated to a predetermined temperature in the heating bath 62.

(Manufacturing Method 1)

Description will be made for a case in which the entire magnetic field generator 10 is heated.

First, the magnetic field generator 10 is assembled completely. In this step, the permanent magnets 18 and 28 are already magnetized using e.g. the magnetizer 50 such as shown in FIG. 4, to a magnetization rate exceeding 99.9%. Here, the term "magnetization to a magnetization rate exceeding 99.9%" means a generally saturated state of magnetization. In general, this is achieved by applying a magnetic field not smaller than three times a coercive force of the magnet.

Then, a room which can accommodate the magnetic field generator 10 is heated uniformly to a predetermined temperature by a heater, in which the magnetic field generator 10 is introduced, heated and allowed to demagnetize. The magnetic field generator 10 is heated to a desired temperature not lower than 40° C. and not higher than 70° C. for example. Within this temperature range, it is possible to control the permanent magnets 18 and 28 to have a magnetization rate not smaller than 80% and not greater than 99.9% at the normal temperature. The heating temperature is determined by a desired rate of magnetization. Thereafter, a final magnetic field adjustment is performed.

According to this method, the heating process performed after the complete assembly of the magnetic field generator 10 reduces the magnetization rate of the permanent magnets 18 and 28 to not smaller than 80% and not greater than 99.9%. This enables to reduce demagnetization thereafter, caused by aging or heat. Thus, it is possible to reduce decline in the magnetic field intensity and deterioration of the magnetic field uniformity of the magnetic field generator 10 during transportation.

The main magnet or the permanent magnet 18 is prone to demagnetization by the permanent magnet 28 used for prevention of magnetic flux leakage. However, according to the method described, the magnetic field generator 10 which includes the permanent magnets 18 and 28 is heated to demagnetize the permanent magnets 18 and 28, and then the final magnetic field adjustment is performed. This reduces deterioration of magnetic field uniformity thereafter, making possible to reduce adverse influence from the permanent magnet 28 which is used for prevention of magnetic flux leakage.

Thus, the magnetic field generator 10 maintains a high level of magnetic field uniformity upon arrival at a place of installation even if it is subjected to a high temperature during transportation.

Alternatively, the magnetic field generator 10 may be heated from within, i.e. heaters may be embedded in the plate yoke 12a, the plate yoke 12b and so on in advance, and turned on to raise the temperature of the magnetic field generator 10 from within. In this case, the entire magnetic field generator 10 is preferably covered with a thermally insulating material such as a foam resin.

(Manufacturing Method 2)

Description will be made for a case in which the pole-piece unit 11a is heated.

First, the pole-piece unit 11a is assembled. In this step, the permanent magnets 18 and 28 are already magnetized using e.g. the magnetizer 50 shown in FIG. 4 to a magnetization rate exceeding 99.9%.

Then, a room which can accommodate the pole-piece unit 11a is heated uniformly by a heater, in which the pole-piece unit 11a is introduced, heated and allowed to demagnetize. Following essentially the same procedure as in the Manufacturing Method 1, the pole-piece unit 11a is heated to a desired temperature of e.g. not lower than 40° C. and not higher than 70° C., depending on a selected rate of magnetization (selected from the range not lower than 80% and not higher than 99.9%). The same procedure is performed to the pole-piece unit 11b.

Thereafter, the pole-piece units 11a, 11b are fixed to the supporting yoke 40 to obtain the magnetic field generator 10, and then a final adjustment on the magnetic field uniformity is performed before shipment.

According to this method, the heating process performed to the assembled pole-piece units 11a, 11b enables to reduce decline in the magnetic field intensity and deterioration of the magnetic field uniformity of the magnetic field generator which includes the pole-piece units 11a, 11b during transportation. The permanent magnet 28 used for prevention of magnetic flux leakage tends to adversely influence the main magnet or the permanent magnet 18. However, according to the method described, the pole-piece units which include the permanent magnets 18 and 28 are heated to demagnetize the permanent magnets 18 and 28, and then the final magnetic field adjustment is performed. This reduces deterioration of magnetic field uniformity thereafter, making possible to reduce adverse influence from the permanent magnet 28 which is used for prevention of magnetic flux leakage. Further, this method requires a smaller heating space than the case where heating step is performed after the entire magnetic field generator 10 has been assembled.

(Manufacturing Method 3)

Description will be made for a case in which the permanent magnet 18 is assembled, heated and then magnetized.

In this case, the following steps are performed after assembling the permanent magnet 18 and before bonding to the plate yokes 12a, 12b:

First, the permanent magnet 18 is placed in e.g. the heating bath 62 of the heating unit 60 shown in FIG. 5, to heat the entire permanent magnet 18 uniformly to e.g. 60° C. It should be noted that the permanent magnet 18 can be heated at a desired temperature of e.g. not lower than 40° C. and not higher than 70° C. The heated permanent magnet 18 is then taken out of the heating bath 62. Then, using e.g. the magnetizer 50 shown in FIG. 4, a momentarily high magnetic field (not smaller than 3 T) is applied to the permanent magnet 18, to magnetize the permanent magnet 18 to a magnetization rate not smaller than 80% and not greater than 99.9%. Since the magnetization rate is lower under high temperatures than under low temperatures, magnetizing the permanent magnet 18 which is heated to a high temperature has essentially the same effect as magnetizing and then thermally demagnetizing the permanent magnet 18 (See Manufacturing Method 5 to be described later).

The permanent magnet 28 is processed using the same step.

Thereafter, the permanent magnets 18 and 28 are fixed to the plate yokes 12a, 12b, and the magnetic field generator 10 is assembled.

The magnetic field generator 10 using the permanent magnets 18 and 28 obtained through this method enables to reduce decline in the magnetic field intensity and deterioration of the magnetic field uniformity during transportation. Further, this method requires a smaller heating space than the case where heating step is performed to the entire the magnetic field generator 10 or the pole-piece units 11a, 11b, so the heating unit 60 may be small.

Once magnetized, permanent magnets have magnetic power, exerting pulling and repelling forces. For safety reasons therefore, it is preferable that the heated permanent magnets should be magnetized and used successively, only in a quantity to be attached to the plate yokes 12a, 12b.

(Manufacturing Method 4)

Description will be made for a case in which the permanent magnet 18 is assembled, magnetized and then demagnetized by applying a reverse magnetic field.

In this case, the following steps are performed after assembling the permanent magnet 18 and before bonding to the plate yokes 12a, 12b:

First, a momentarily high magnetic field (not smaller than 3 T) is applied to the permanent magnet 18, to magnetize the permanent magnet 18 to a magnetization rate exceeding 99.9%. Then, the magnetized permanent magnet 18 is demagnetized by applying a reverse magnetic field (0.1 T-2T) to reduce the magnetization rate to not smaller than 80% and not greater than 99.9%. The magnetization and the demagnetization of the permanent magnet 18 are made by using e.g. the magnetizer 50 shown in FIG. 4.

The permanent magnet 28 is processed using the same step.

Thereafter, the permanent magnets 18 and 28 are fixed to the plate yokes 12a, 12b, and the magnetic field generator 10 is assembled.

According to the magnetic field generator 10 using the permanent magnets 18 and 28 obtained through this method, it is possible to reduce decline in the magnetic field intensity and deterioration of the magnetic field uniformity during transportation. Further, deferring from the demagnetization by heating, this method requires a shorter time, and so operation efficiency is high.

(Manufacturing Method 5)

Description will be made for a case in which the permanent magnet 18 is assembled, magnetized and then thermally demagnetized.

In this case, the following steps are performed after assembling the permanent magnet 18 and before bonding to the plate yokes 12a, 12b:

First, a momentarily high magnetic field (not smaller than 3 T) is applied to magnetize the permanent magnet 18 to a magnetization rate exceeding 99.9% by using e.g. the magnetizer 50 shown in FIG. 4. Then, the magnetized permanent magnet 18 is thermally demagnetized by placing in a furnace (40° C.-70° C.) provided with heaters, down to a magnetization rate not smaller than 80% and not greater than 99.9%.

The permanent magnet 28 is processed using the same step.

The permanent magnets 18 and 28 are fixed to the plate yokes 12a, 12b, and the magnetic field generator 10 is assembled.

According to the magnetic field generator 10 using the permanent magnets 18 and 28 obtained through this method, it is possible to reduce decline in the magnetic field intensity and deterioration of the magnetic field uniformity during transportation.

Alternatively to the manufacturing methods described so far, the permanent magnets may be first slightly magnetized in a reverse direction, and then magnetized in the normal direction to achieve the desired rate of magnetization. In this case, the greater the rate of magnetization in the reverse direction, the greater must be the magnetic field intensity to be applied thereafter in the normal magnetization direction.

Further, as an alternative step of demagnetization, a reverse magnetic field may be applied to the entire magnetic field generator 10 or the entire pole-piece units 11a, 11b.

As a reference, an experiment on a permanent magnet will be described with reference to FIG. 6.

In the experiment, the permanent magnet was provided by NEOMAX-47. The permanent magnet was subjected to a heating process (magnetization to 100%, followed by heating to 50° C. for 24 hours) in one case, whereas no heating process was made in another case. The two cases were compared with each other in terms of change in magnetic field intensity over time.

The permanent magnet which was subjected to the heating process was set to a magnetization rate of 99% whereas the permanent magnet not subjected to the heating process was set to a magnetization rate of 100%. Then, during the experiment, the permanent magnets were maintained at 32° C. without a reverse magnetic field.

Figure 6:
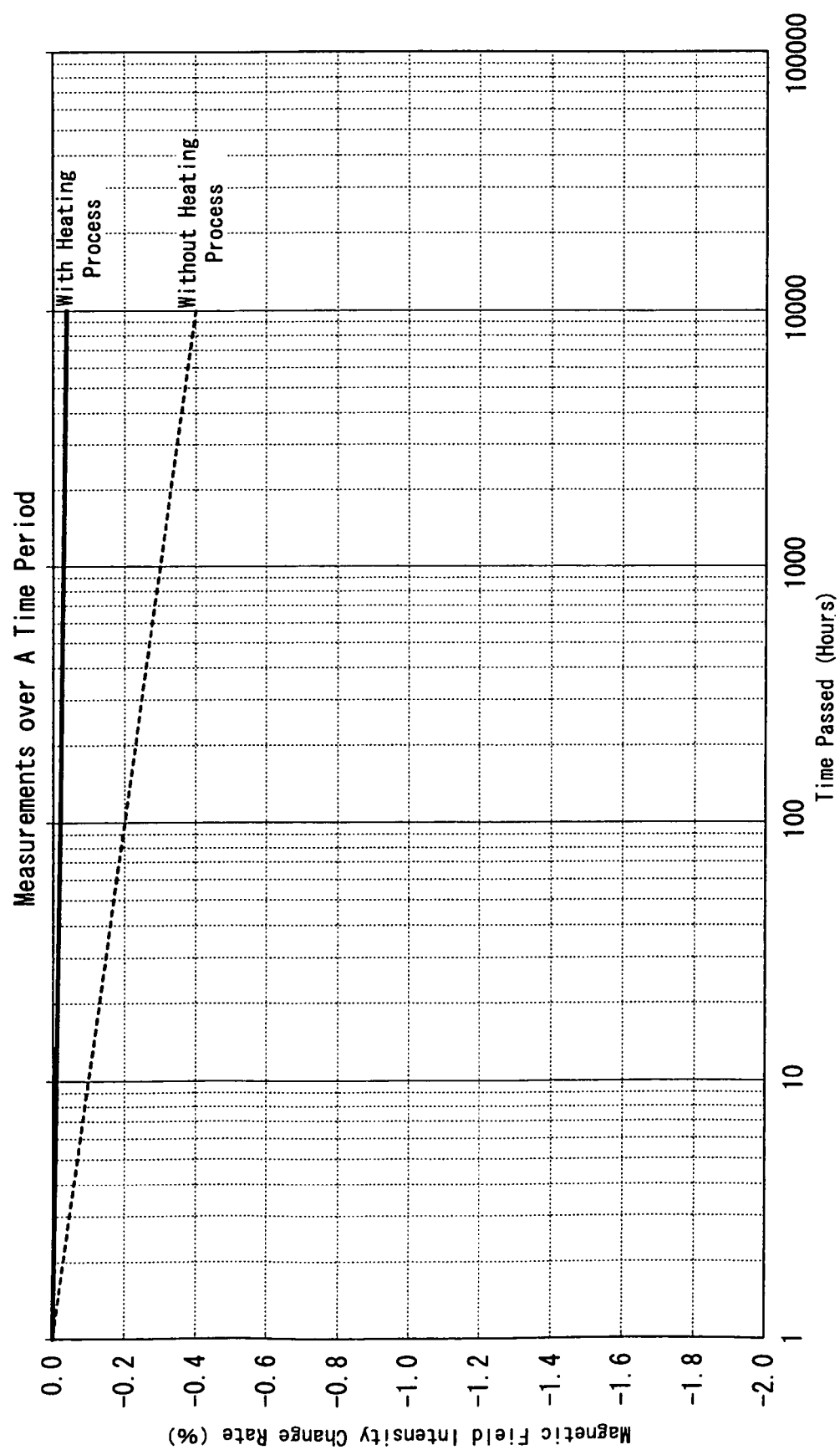
FIG. 6 is a graph showing changes in magnetic field intensity of a permanent magnet over time.

As understood from FIG. 6, the heating process remarkably reduces the rate of magnetic field change of the permanent magnet over the case where the permanent magnet is not subjected to the heating process.

Next, another experiment will be described with reference to FIG. 7.

In the experiment, a permanent magnet was provided by NEOMAX-47. One permanent magnet was subjected to heating process at 55° C., another permanent magnet was subjected to a demagnetizing process by reverse magnetic field process, and still another permanent magnet was subjected to none of them, and comparison was made in terms of change in their magnetic field intensity to temperature increase.

In the "55° C. heating process", the permanent magnet was magnetized to a magnetization rate of 100%, and then maintained at 55° C. for 2 hours, to obtain a magnetization rate of 99.9%. In the "demagnetizing process by reverse magnetic field", the permanent magnet was magnetized to a magnetization rate of 100%, and then demagnetization was performed by increasing the reverse magnetic field until surface magnetic field intensity became equal to that of the permanent magnet processed in the 55° C. heating process.

Figure 7:
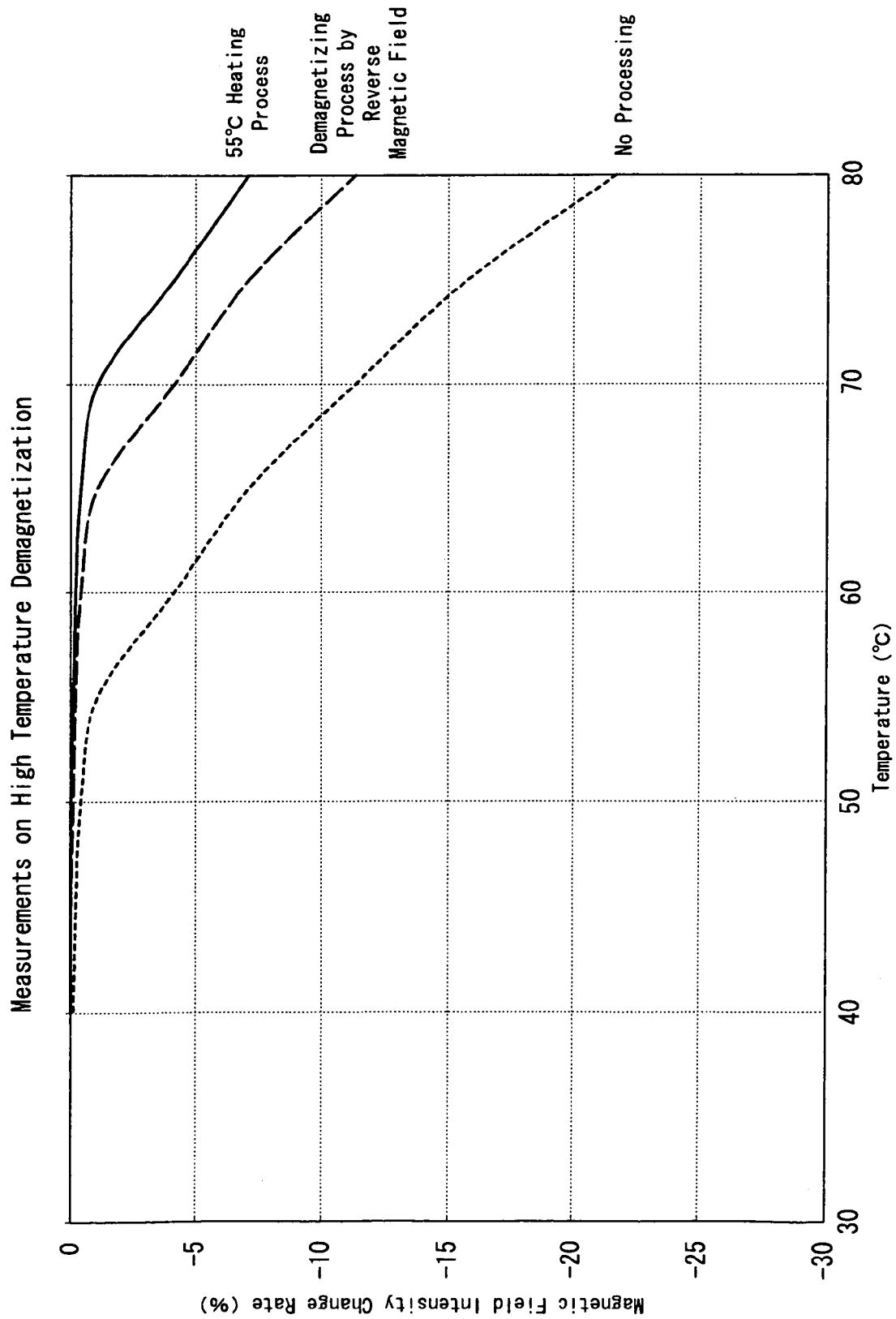
FIG. 7 is a graph showing a change in magnetic field intensity of a permanent magnet caused by temperature increase.

As understood from FIG. 7, the 55° C. heating process and the demagnetizing process by reverse magnetic field remarkably reduce the rate of change in the magnetic field of the permanent magnet to temperature increase, compared to the case where the permanent magnet was not subjected to these processes.

Further, the 55° C. heating process reduces the rate of magnetic field change in the permanent magnet caused by temperature increase more than the demagnetizing process by reverse magnetic field. This is because the heating process works uniformly to the entire permanent magnet whereas in the demagnetizing process by reverse magnetic field the demagnetization does not work as uniformly to the permanent magnet.

The results shown in FIG. 6 and FIG. 7 suggest that use of the permanent magnets which have undergone the heating process or the demagnetizing process by reverse magnetic field as the main magnet and/or the magnetic flux leakage prevention magnet enables to reduce demagnetization of the main magnet and of the magnetic flux leakage prevention magnet due to aging and temperature increase, and to reduce changes in magnetic field intensity as well as to reduce deterioration of the magnetic field uniformity after the magnetic field generator has been assembled.

FIG. 8 shows a magnetic flux distribution in the magnetic field generator.

Figure 8A:
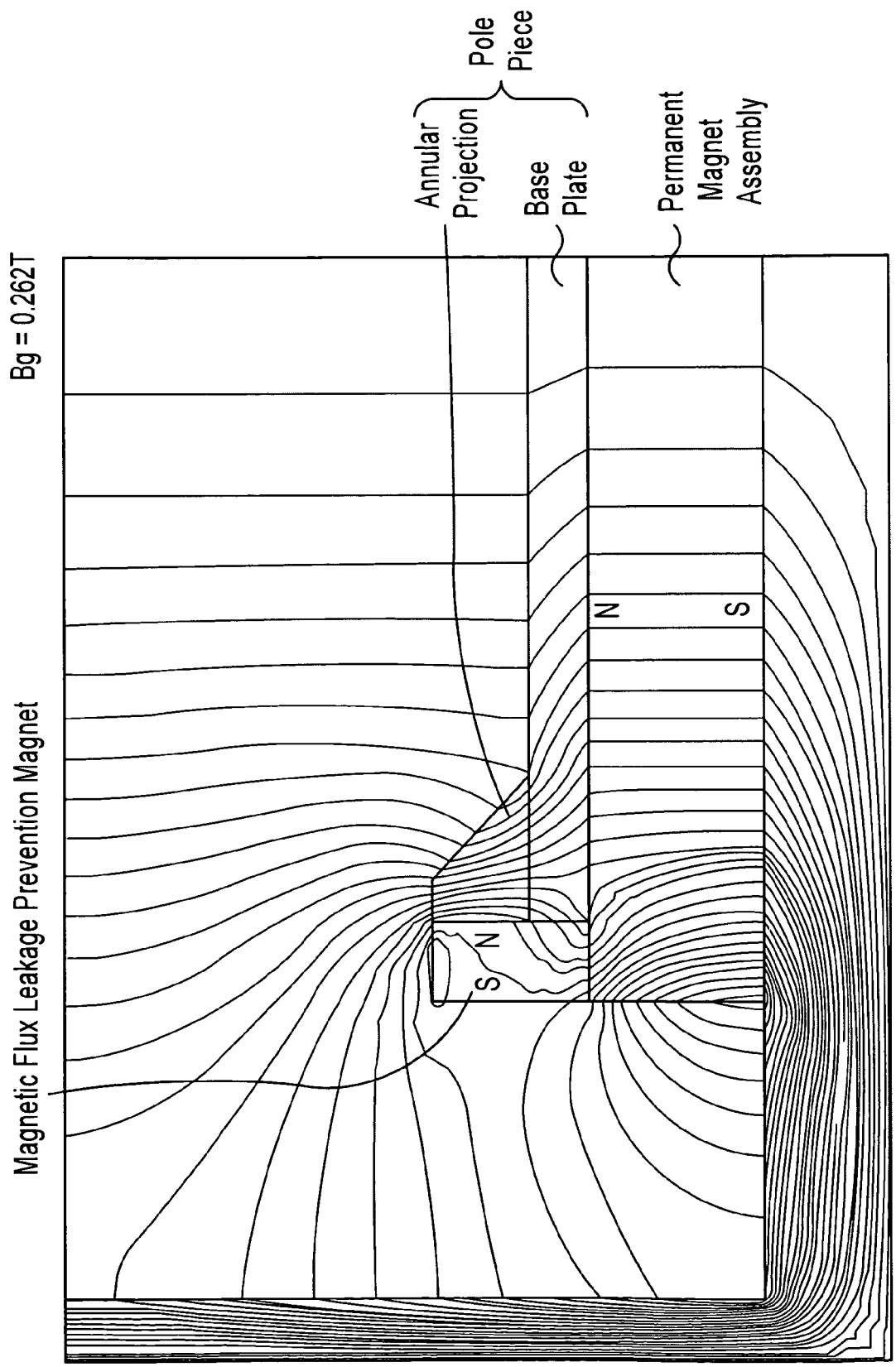
Figure 8B:
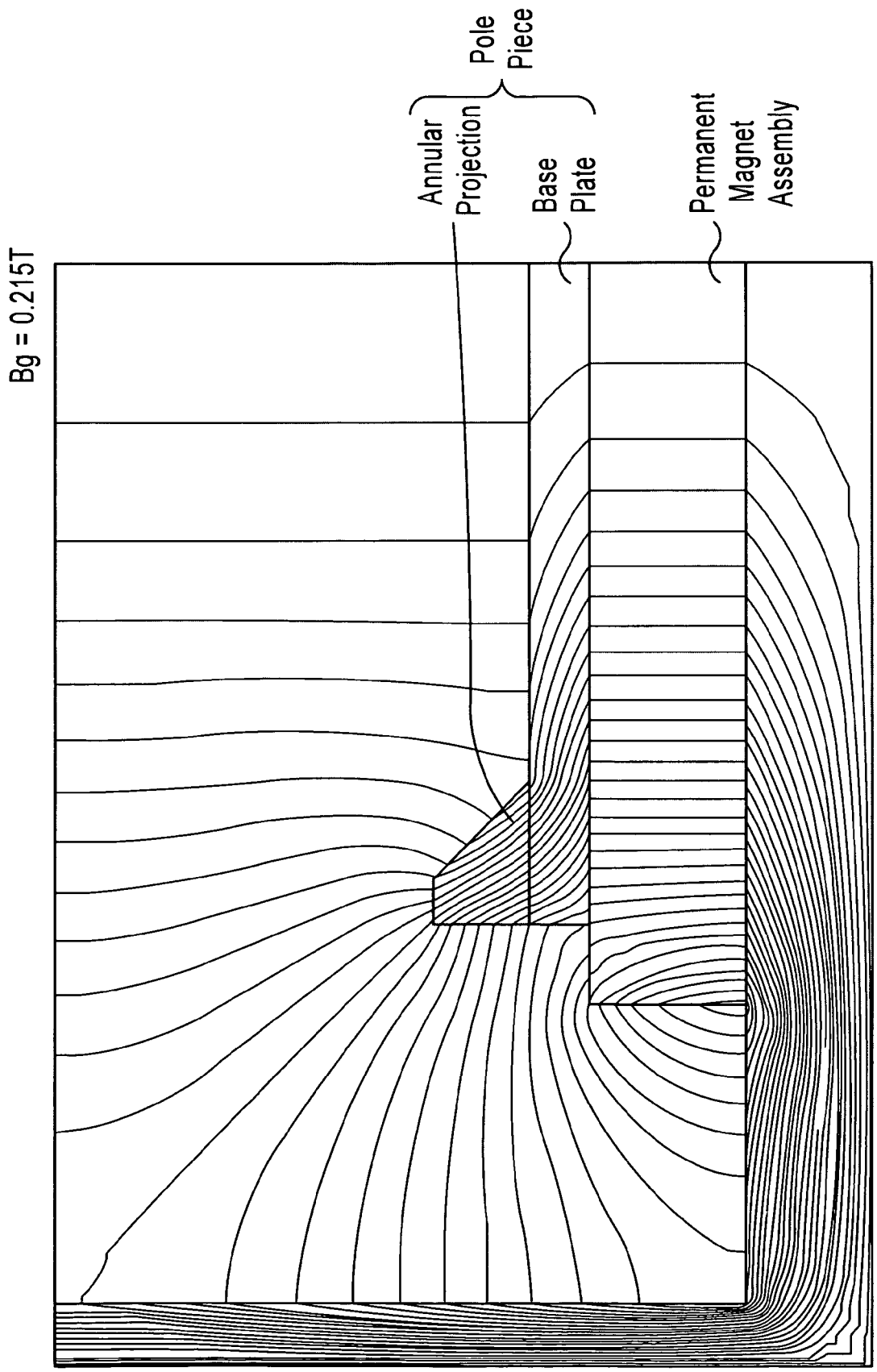
FIG. 8(b) shows a magnetic flux distribution in a magnetic field generator which does not have magnetic flux leakage prevention magnets.

FIG. 8(a) shows a magnetic flux distribution in a magnetic field generator which has magnetic flux leakage prevention magnets, whereas FIG. 8(b) shows a magnetic flux distribution in a magnetic field generator which does not have magnetic flux leakage prevention magnets. It should be noted that the case in FIG. 8(a) recorded a center magnetic field intensity of 0.262 T, whereas the case in FIG. 8(b) recorded a center magnetic field intensity of 0.215 T.

As understood from comparison between (a) and (b) in FIG. 8, use of the magnetic flux leakage prevention magnets induces a magnetic flux between the pole pieces whereas a magnetic flux becomes less on the outer side of the magnetic flux leakage prevention magnets. In other words, the magnetic flux leakage prevention magnets and the permanent magnet assembly repel each other and thus are prone to demagnetize each other. Therefore, a magnetic field generator which uses magnetic flux leakage prevention magnets is more prone to changes in magnetic field intensity and distribution by temperature increase. Therefore, application of this invention to magnetic field generators which use magnetic flux leakage prevention magnets is effective in reducing the deterioration of magnetic field uniformity.

Further, R—Fe—B magnets used in the permanent magnets 18 and 28 are more prone to thermal demagnetization at relatively low temperatures than ferrite magnets and Sm—Co magnets. However, it is possible to reduce the thermal demagnetization of the R—Fe—B magnets by lowering the magnetization rate as in the above embodiments.

If the permanent magnet 18 is required to have a high residual magnetic flux density, a ternary-system R—Fe—B magnet which does not essentially contain Co is used as described above. In this case, thermal demagnetization is greater than in a permanent magnet containing Co, and so the advantage in applying the above embodiment is greater. The advantage in applying the above embodiment is also significant when the magnet does not essentially contain Dy.

Further, since it is possible to reduce change in magnetic field intensity and deterioration of the magnetic field uniformity, even in a case where the space between the pole-piece units must include the uniform magnetic field space F, i.e. the magnetic field space which has magnetic field uniformity errors within 100 ppm, it is easy to control the errors within the given range.

Further, it is possible to reduce change in the magnetic field intensity and deterioration of the magnetic field uniformity even when, for example, the magnetic field generator is transported using a container which is not provided with sufficient air conditioning.

Still further, it is possible to reduce change in the magnetic field intensity even when the uniform magnetic field space F has a large magnetic field intensity such as 0.25 T or greater, i.e. when the change tends to be large.

The present invention being thus far described and illustrated in detail, it is obvious that these description and drawings only represent an example of the present invention, and should not be interpreted as limiting the invention. The spirit and scope of the present invention are only limited by words used in the accompanied claims.

The invention claimed is:

1. A method of manufacturing a magnetic field generator including an R—Fe—B magnet and a yoke holding the R—Fe—B magnet, the method comprising:
   a first step of assembling the R—Fe—B magnet and the yoke into the magnetic field generator, while the R—Fe—B magnet is in a generally saturated state of magnetization, and then performing
   a second step of demagnetizing the R—Fe—B magnet by heating, at a temperature not lower than 40° C. and not higher than 70° C., the magnetic field generator, including at least the yoke and the R—Fe—B magnet, which has already been assembled,
   whereby the R—Fe—B magnet is controlled to have a magnetization rate not smaller than 80% and not greater than 99.9% at the normal temperature.

2. The method of manufacturing a magnetic field generator according to claim 1, wherein:
   the first step includes assembling a pole-piece unit by fixing magnets, including the R—Fe—B magnet, to a plate yoke; and
   the second step includes heating the pole-piece unit which has been assembled, and comprising
   a third step of fixing the heated pole-piece unit to a supporting yoke.

3. The method of manufacturing a magnetic field generator according to claim 1, wherein the magnetic field generator includes a plurality of magnets, including the R—Fe—B magnet.

4. The method of manufacturing a magnetic field generator according to claim 3, wherein the magnetic field generator includes a plurality of R—Fe—B magnets.

5. The method of manufacturing a magnetic field generator according to claim 1, wherein the generally saturated state of magnetization comprises a magnetization rate exceeding 99.9%, the magnetization rate being a ratio of magnetic flux density to maximum magnetic flux density.

6. The method of manufacturing a magnetic field generator according to claim 5, wherein the second step comprises demagnetizing the R—Fe—B magnet to a magnetization rate not smaller than 80%.

7. The method of manufacturing a magnetic field generator according to claim 1, including applying a magnetic field not smaller than three times a coercive force of the magnet to achieve the generally saturated state of magnetization.

* * * * *